United States Patent
Taguchi et al.

(10) Patent No.: US 6,197,686 B1
(45) Date of Patent: Mar. 6, 2001

(54) ALUMINUM METALLIZATION BY A BARRIER METAL PROCESS

(75) Inventors: Mitsuru Taguchi, Tokyo; Kazuhide Koyama, Kanagawa, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/082,432

(22) Filed: Jun. 28, 1993

Related U.S. Application Data

(63) Continuation of application No. 07/844,128, filed on Mar. 3, 1992, now abandoned.

(51) Int. Cl.$^7$ .................................................. H01L 21/44

(52) U.S. Cl. ......................... 438/656; 438/652; 438/653

(58) Field of Search .................................. 437/190, 192, 437/194, 195, 197; 438/652, 653, 654, 656

(56) References Cited

U.S. PATENT DOCUMENTS

| | | | |
|---|---|---|---|
| 4,755,480 | * 7/1988 | Yau et al. | 437/190 |
| 4,784,973 | * 11/1988 | Stevens et al. | 437/190 |
| 4,829,024 | * 5/1989 | Klein et al. | 437/189 |
| 4,960,732 | * 10/1990 | Dixit et al. | 437/190 |
| 4,970,176 | * 11/1990 | Tracy et al. | 437/197 |
| 5,008,216 | * 4/1991 | Huang et al. | 437/195 |
| 5,070,036 | * 12/1991 | Stevens | 437/200 |
| 5,290,731 | * 3/1994 | Sugano et al. | 437/190 |

FOREIGN PATENT DOCUMENTS

| | | | |
|---|---|---|---|
| 1275332 | * 10/1990 | (CA) . | |
| 62-113421 | * 5/1987 | (JP) | 437/190 |
| 62-274624 | * 11/1987 | (JP) | 437/190 |
| 63-174336 | * 7/1988 | (JP) | 437/190 |
| 63-67763 | * 3/1990 | (JP) . | |
| 185722 | * 8/1991 | (JP) | 437/190 |

OTHER PUBLICATIONS

L.T. Lamont, Semicon/Europa, p. 148 (1987), Full Text.*
T. Maeda et al. "Effects of Ti interlevel existence in Al/Ti/Tin/Ti Structure . . . ", VLSI Symposium, 1985, P. 50 only.*
C.-K. Hu, et al. "Dry etching of Tin/Al(cv)/Si . . . " J. Vac. Sci Technol., A8(3) May/Jun. 1990 1498–1502.*
Translation of Japanese Pat 3–185722 to Y. Abe.*
L.T. Lamont, "Materials issues in Planarization of Single & Multilayer Structures", Semicon/Europa :ADV. Proc. Challenges, p.148 (1987) Abstract only.*

(List continued on next page.)

*Primary Examiner*—Charles Bowers
*Assistant Examiner*—Evan Pert
(74) *Attorney, Agent, or Firm*—Sonnenschein, Nath & Rosenthal

(57) ABSTRACT

A metallization method for filling an Al-based material in a contact hole having a barrier metal structure, in which high barrier characteristics and high step coverage may be achieved simultaneously, is proposed. The present invention is based on two concepts. The first concept is to provide a Ti/TiON/Ti three-layer barrier metal structure and to deposit a layer of the Al-based material by high temperature sputtering. Sufficient barrier characteristics may be provided by the intermediate TiON layer of the three-layer structure. The interface between the Al-based layer and the barrier metal layer is the Ti layer having excellent wetting characteristics with respect to the Al-based layer so that the contact hole can be filled uniformly without forming voids. The second concept is to set the substrate heating temperature during high temperature sputtering to 450 to 550° C. and to set the deposition rate to 0.6 μm/minute or less. In this manner, moderate Al migration and sufficiently long reaction time may be assured even on a Ti layer which partially reflects the rough surface morphology of the TiON layer for further improving reliability in filling.

4 Claims, 2 Drawing Sheets

OTHER PUBLICATIONS

K. Koyama et al., "High Aspect Ratio Hole Filling by Al High Temp. Sputtering," VLSI–MMIC Conference, IEEE Jun. 11–13, 1991.*

Wolf, *Silicon Processing for the VLSI Era,* vol. 2, Lattice Press, Suset Beach, CA, 1990 pp. 109–110.*

Wolf et al., *Silicon Processing for the VLSI Era,* vol. 1, Lattice Press, Sunset Beach, CA, 1986, pp. 367–371.*

Hariu et al, "The Properties of Al–Cu/Ti Films Sputter Deposited at Elevated Temperatures and High DC Bias", *IEEE/IRPS,* 1989, pp. 210–214.

*Semiconductor World,* Dec. 1989, pp. 186–188.

* cited by examiner

ALUMINUM METALLIZATION BY A BARRIER METAL PROCESS

CROSS-REFERENCE TO RELATED APPLICATIONS

This application is a continuation of application Ser. No. 07/844,128 filed Mar. 3, 1992 and now abandoned.

BACKGROUND OF THE INVENTION

1. Field of the Invention

This invention relates to a method for metallization in the preparation of semiconductor devices. More particularly, it relates to a method for aluminum metallization for uniformly burying an aluminum-based material in a contact section having a barrier metal structure.

2. Description of Related Art

In keeping up with an increasing refinement of the design rule for semiconductor devices, as exemplified by VLSIs or ULSIs of recent origin, the contact hole formed in an interlayer insulating film for establishing electrical an connection between an upper metallization and a lower metallization is becoming increasingly smaller in diameter, such that the aspect ratio now exceeds unity. The upper metallization is usually formed by depositing an Al-based material by sputtering. However, it is difficult with this method to achieve sufficient step coverage to fill the contact hole having such a high aspect ratio so that a disconnection is frequently produced.

Recently, a high temperature sputtering has been proposed as a method for improving step coverage. This technology resides in carrying out sputtering with heating a wafer by a heater block or the like to several hundreds of degrees centigrade and applying an RF bias through the heater block, as introduced in, for example, Monthly Semiconductor World, December issue, 1989, pages 186 to 188, by Press Journal, or in IEEE/IRPS, 1989, pages 210 to 214. It is possible with this method to improve step coverage under Al reflow effects under elevated temperatures and ion impacts by the application of the bias voltage for forming the Al-based layer having a flattened surface. In these treatises, it is reported that, when a titanium (Ti) layer is provided as an underlying layer for the Al-based layer, the Ti layer contributes to surface migration of Al atoms to achieve excellent step coverage.

Meanwhile, the Ti layer provided as an underlying layer for the layer of the Al-based material is naturally expected to display the function as a barrier metal layer. However, the Ti layer, while being an excellent contact material from the viewpoint of achieving low-resistance ohmic contact, cannot achieve the function of the barrier metal, if used alone. The reason is that, even if the Ti layer is interposed by itself between the silicon (Si) substrate and the Al-based layer, the reaction between Si and Ti and the reaction between Ti and Al proceed simultaneously, so that Al spikes onto the Si substrate cannot be prevented from being produced. The conventional practice has been to adopt a two-layer barrier metal composed of, for example, a TiN layer superimposed on a Ti layer (Ti/TiN system). More recently, a two-layer barrier metal composed of a Ti layer and a TiON layer (Ti/TiON system), produced by introducing oxygen during deposition of the TiN layer, has been proposed with a view to improving the effects of preventing Al diffusion in the TiN grain boundary by oxygen segregation in the boundary.

However, when barrier metal such as Ti/TiON barrier metal, is previously formed in a contact section, an Al-based material cannot be filled uniformly in the contact hole if the Al-based material is to be deposited by high temperature bias sputtering. It is assumed that, in a wafer shown in FIG. 1, an interlayer insulating film 3 having a contact hole 4 is formed on a silicon substrate 1, in which an impurity diffusion layer 2 is formed previously so that the contact hole 4 is contiguous to the impurity diffusion region 2, and a Ti layer 5 and a TiON layer 6 are stacked step by step so as to overlie at least the contact hole 4 to provide a barrier metal layer 7. If it is attempted to deposit a layer 8 of an Al-based material on the wafer by high temperature bias sputtering, the material cannot be deposited or buried uniformly in the contact hole, because voids 9 tend to be produced. It is because Al in the course of high temperature sputtering is in an intermediate state between the liquid state and the solid state and highly sensitive to the morphology of the surface of the underlying layer. That is, the TiON layer 6 has a columnar crystal structure in which the crystals are oriented with the longitudinal direction thereof extending substantially orthogonally with respect to the film surface, so that the layer exhibits rough surface morphology and is inferior in wettability and reactivity with respect to the Al-based material. Our experiments indicated that the buried state of the Al-based material could not be improved when the deposition rate was lowered to about half the usual deposition rate for the purpose of promoting the reaction at the boundary between TiON and Al.

OBJECT AND SUMMARY OF THE INVENTION

In view of difficulties met in the prior art in forming a contact hole satisfying high barrier properties and superior step coverage properties simultaneously, an object of the present invention is to provide a method for forming a metallization which will satisfy these two requirements simultaneously.

The present invention is based on two improvements in the metallization process. One improvement resides in providing a Ti/TiON/Ti three-layer barrier metal structure and forming a layer of the Al-based material by a high temperature process, and the other resides in executing a high temperature process in at least a portion of the deposition process of the Al-based material under conditions of a lower deposition rate.

The first point of improvement is aimed at improving wettability and reactivity between the Al-based material and the underlying layer for facilitated intrusion of the Al-based material in the contact hole by using the three-layer barrier metal structure in which a Ti layer is added to the conventional Ti/TiON structure so that one of the Ti layers is arranged at a contact surface with a layer of the Al-based material. According to the present invention, the three-layer barrier metal structure is used and the Al-based material is buried in the contact hole by a one-stage high temperature process or by a two-stage process. With the latter two-stage process, a first layer of an Al-based material is deposited in a first step to a thin thickness so as not to completely fill the contact hole and a second layer of the Al-based material is deposited to a thicker thickness in the second high-temperature step. For the high temperature process, high temperature sputtering, high temperature CVD or high temperature vapor deposition, may be employed.

The second point of improvement is optimizing the conditions of the high temperature process for improving process reliability and reproducibility. According to the present invention, it is the Ti layer that is in contact with the layer of the Al-based material, as explained hereinabove.

However, this Ti layer partially reflects the rough surface morphology associated with the columnar crystal structure of the underlying TiON layer, so that it is inferior in smoothness to the Ti layer formed directly on the surface of e.g. a silicon substrate. For this reason, it is highly effective to optimize the conditions for the high temperature process.

It is noted that the substrate heating temperature is selected to be 450 to 550° C. in consideration of migration characteristics on deposition of the Al-based material on the substrate. It is accepted in general that, when forming a film of an eutectic-forming alloy by a vacuum thin film forming technique, the temperature, which is not higher than about 75% of the eutectic point, is insufficient for atoms etc. flying from a target or a source of evaporation to the substrate to undergo migration on the substrate. Since the eutectic point of an Al-1% Si alloy, typical of an Al-based material, is about 580° C., the contact hole can be difficult to fill at a temperature range lower than 450° C. because the migration is suppressed at such a temperature. Conversely, at a temperature higher than 550° C., migration is promoted excessively so that the film tends to be formed in separate islands and hence the produced layer of the Al-based material tends to present a discontinuous structure.

On the other hand, the deposition rate of 0.6 $\mu$m/minute is rather low in view of the accepted technical common sense in the field of the vacuum thin film forming technique. In sputtering, for example, the conventional deposition rate is usually not lower than 1 $\mu$m/minute in order to prevent emission gases in the apparatus from being captured in the film as impurities. However, according to the present invention, it is necessary to lower the deposition rate to assure prolonged contact between the Al-based material and the underlying layer in order that burying may proceed while the reaction between the Al-based material and the underlying layer is promoted simultaneously. Since an evacuation system of higher performance is available at present, deposition of the layer of the Al-based material can be sufficiently achieved, even under such low deposition rate, if meticulous attention is paid to elimination of possible pollution sources.

The above mentioned optimum conditions may be applied to the one-stage high temperature process or to the two-stage process for filling of contact holes.

It is seen from above that superior barrier characteristics may be achieved by the present invention by the three-layer barrier metal structure while superior step coverage characteristics may also be achieved by the Ti layer provided in the interface region adjacent to the layer of the Al-based material. The contact holes can be filled with the Al-based material with high reliability and reproducibility by optimizing the conditions of high sputtering carried out during at least a portion of the deposition process.

Thus the present invention may be employed most effectively in the preparation of semiconductor devices which are designed on the basis of highly refined design rules and which should satisfy the requirements for high integration, high performance and high reliability.

BRIEF DESCRIPTION OF THE DRAWINGS

FIGS. 2a and 2b are schematic cross-sectional views showing a metallization method according to an embodiment of the present invention, step by step, wherein FIG. 2a shows the state in which a three-layer barrier metal structure has been deposited on an interlayer insulating film in which a contact hole is previously formed and FIG. 2b shows the state in which the contact hole has been filled satisfactorily by an Al-1% Si layer.

DETAILED DESCRIPTION OF THE INVENTION

The present invention will be explained in detail with reference to non-limiting Examples.

EXAMPLE 1

In the present Example, one-stage high temperature sputtering is used for filling a contact hole with an Al-1% Si alloy. The process is explained by referring to FIGS. 2a and 2b.

Figure 1:
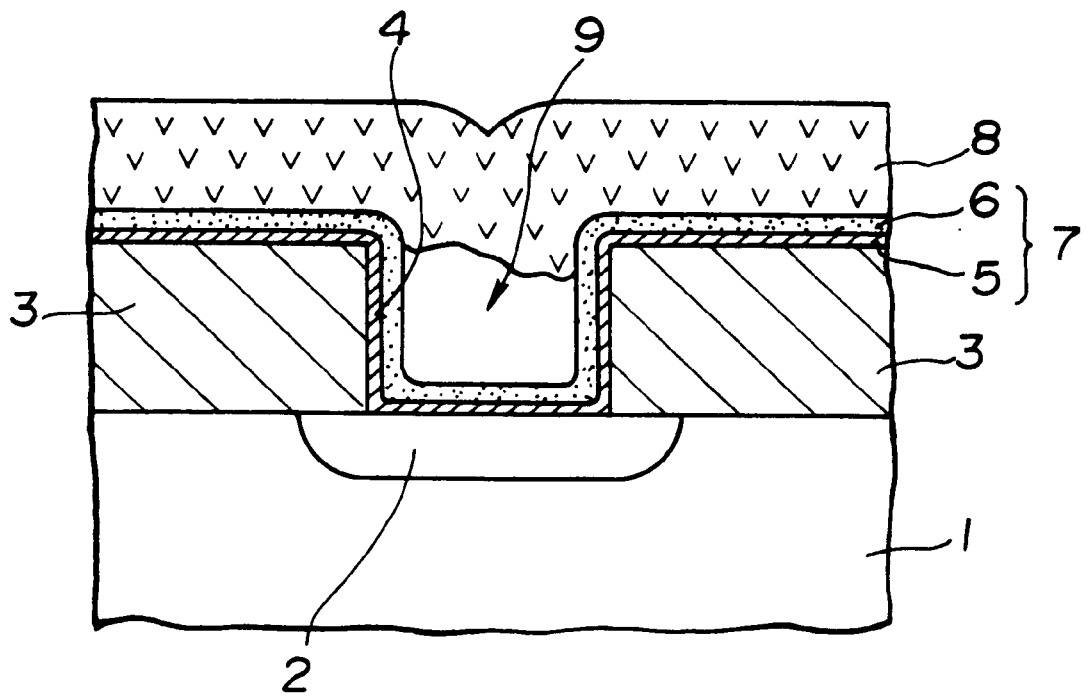
FIG. 1 is a schematic cross-sectional view showing the conventional method for metallization in which the Al-based material is not filled uniformly in the contact hole having a two-layer structure so that voids are produced.
Figure 2A:
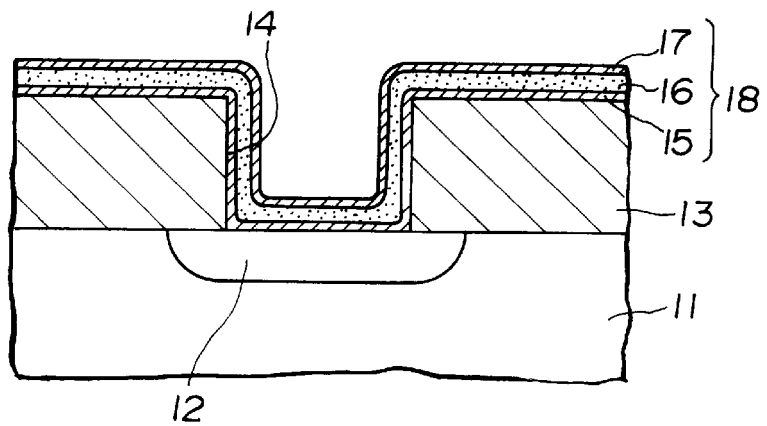

Referring first to FIG. 2a, a wafer in which an interlayer insulating film 13 formed of, for example, silicon oxide, was deposited on a silicon substrate 11 in which an impurity diffusion region 12 was previously formed, and a contact hole 14 reaching the impurity diffusion region 12 was formed in the insulating film 13, was used, and a barrier metal layer 18 was formed on the entire wafer surface by continuously depositing a first Ti layer 15, a TiON layer 16 and a second Ti layer 17 on the wafer in this order.

The first Ti layer 15 and the second Ti layer 17 were formed to thicknesses of approximately 30 nm each by sputtering under typical operating conditions of an Ar flow rate of 100 SCCM, a gas pressure of 0.47 Pa (3.5 mTorr), a d.c. sputtering power of 4 kW, a sputtering time of 5 seconds and a sputtering rate of 0.36 $\mu$m/minute.

The TiON layer 16 was formed by sputtering under typical operating conditions of an Ar flow rate of 40 SCCM, an $H_2$-6% $O_2$ mixed gas flow rate of 70 SCCM, a gas pressure of 0.47 Pa (3.5 mTorr), a d.c. sputtering power of 5 kW, a substrate temperature of 150° C., a sputtering time of 60 seconds and a sputtering rate of 0.1 $\mu$m/minute.

Figure 2B:
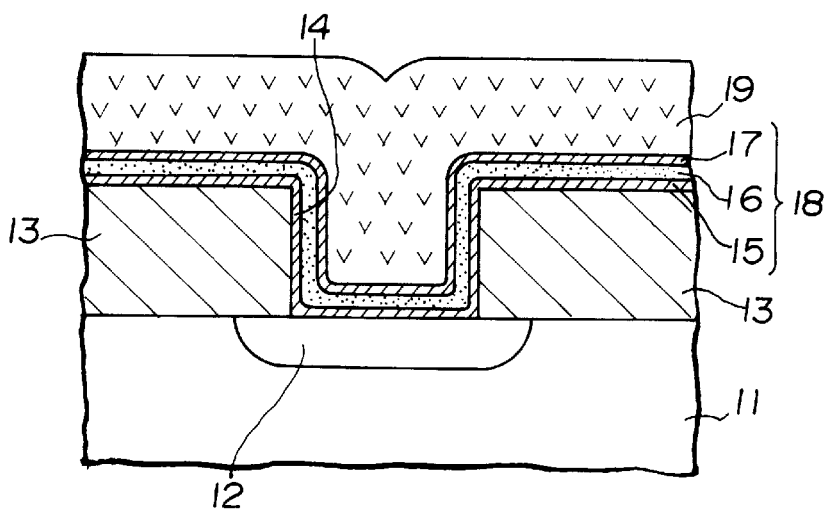

An Al-1% Si layer 19 was then formed to a thickness of approximately 500 nm by sputtering under typical operating conditions of an Ar flow rate of 100 SCCM, a gas pressure of 0.47 Pa (3.5 mTorr), a d.c. sputtering power of 4.5 kW, an RF bias voltage of 0 volts, a sputtering time of 100 seconds and a sputtering rate of 0.3 $\mu$m/minute. Under these conditions, prolonged time of contact betweeen the Al-1% Si alloy and the underlying second Ti layer 17 could be maintained so that the filling of the contact hole proceeded while the reaction therebetween was promoted. In this manner, satisfactory filling free of voids could be achieved, as shown in FIG. 2b.

EXAMPLE 2

In the present example, the Al-1% Si alloy was buried in the contact hole by two-stage sputtering. This process is explained by referring to FIGS. 2a and 2b and also to FIG. 3.

Figure 3:
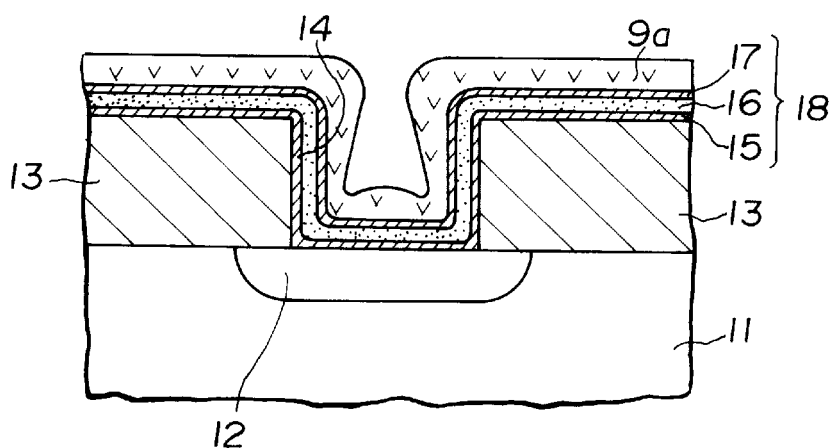
FIG. 3 is a schematic cross-sectional view showing a metallization method according to a modified embodiment of the present invention, in which the contact hole has been filled halfway with the first Al-1% Si layer.

A wafer similar to that used in FIG. 2a was prepared and subjected to a first-stage sputtering under typical operating conditions of an Ar flow rate of 100 SCCM, a gas pressure of 0.47 Pa (3.5 mTorr), a d.c. sputtering power of 22.5 kW, an RF bias voltage of 0 volts, a sputtering time of 5 seconds and a sputtering rate of 1.2 $\mu$m/minute, without heating the substrate. As a result, a first Al-1% Si layer 9a having a thickness of approximately 100 nm was conformally formed after the pattern of the contact hole 14, as shown in FIG. 3.

Then, as a second stage sputtering, the reverse side of the substrate was contacted with a hot Ar gas for heating the substrate to about 500° C., and high temperature bias sputtering was carried out under operating conditions of a d.c. sputtering power of 10.5 kW, an RF bias voltage of 300 volts (13.56 MHz), a sputtering time of 40 seconds and a sputtering rate of 0.6 μm/minute. In this manner, the Al-1% Si alloy was deposited to an additional thickness of 400 nm, so that an Al-1% Si layer 19 having a thickness of 500 nm was ultimately formed on the entire substrate surface, as shown in FIG. 2b. The contact hole 14 was again filled uniformly without forming voids.

In the above process, the sputtering was performed in two stages and the substrate was not heated in the first stage for preventing the growth in the form of islands which is frequently noticed when the substrate is heated to higher temperatures since the start of deposition. Although the sputtering conditions need to be changed over during deposition, the first stage sputtering may be effected at a higher rate, while the second stage sputtering may also be effected at a higher rate than in high temperature sputtering in Example 1. The result is that the time necessary for the deposition process in its entirety may be shortened significantly to improve the throughput.

What is claimed is:

1. A metallization method comprising the steps of:

forming a contact hole in an insulating film on a substrate;

forming a barrier metal layer on at least a bottom and a sidewall of the contact hole, said barrier metal layer comprising a composite titanium/titanium oxynitride/titanium layer; and then depositing a layer of aluminum-based material directly on the uppermost titanium layer in the contact hole while heating the substrate at a temperature of 450° C. to 550° C. to fill the contact hole.

2. A metallization method as claimed in claim 1, wherein said aluminum-based material is deposited at a rate of not greater than 0.6 μm/minute.

3. A metallization method according to claim 1, wherein the step of forming the barrier layer comprises depositing a first titanium layer on the bottom and sidewall, forming a titanium oxynitride layer on the first titanium layer and then depositing a second titanium layer on the titanium oxynitride layer.

4. A metallization method comprising the steps of:

forming at least one contact hole in an insulating film on a substrate;

forming a barrier metal layer structure on at least a bottom and sidewall of the hole by depositing a first titanium layer on the sidewall and bottom, forming a titanium oxynitride layer on the first titanium layer and then depositing a second titanium layer on the titanium oxynitride layer; and then depositing an aluminum-based material directly on the second titanium layer in the contact hole in a single-phase depositing step while heating the substrate at a temperature of 450° C. to 550° C. to completely fill the contact hole.

* * * * *